(12) United States Patent
Kobayashi et al.

(10) Patent No.: US 6,342,542 B1
(45) Date of Patent: Jan. 29, 2002

(54) RADIATION-SENSITIVE RESIN COMPOSITION

(75) Inventors: Satoshi Kobayashi; Hidekazu Shioda, both of Shizuoka; Haruhiko Itoh, Hachiohji, all of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/600,052

(22) PCT Filed: Nov. 1, 1999

(86) PCT No.: PCT/JP99/06074

§ 371 Date: Oct. 12, 2000

§ 102(e) Date: Oct. 12, 2000

(87) PCT Pub. No.: WO00/28383

PCT Pub. Date: May 18, 2000

(30) Foreign Application Priority Data

Nov. 9, 1998 (JP) .............................. 10-317971

(51) Int. Cl.$^7$ ............................ C08F 2/46; G03C 1/492
(52) U.S. Cl. .................. 522/173; 522/162; 522/164; 522/111; 522/188; 522/184; 522/47; 522/105; 430/270.1; 430/326
(58) Field of Search ................................ 522/105, 173, 522/188, 111, 162, 164, 184, 47; 430/270.1, 326

(56) References Cited

U.S. PATENT DOCUMENTS 5,683,856 A * 11/1997 Aoai et al. ............... 430/270.1

* cited by examiner

Primary Examiner—James J. Seidleck
Assistant Examiner—Sanza L. McClendon
(74) Attorney, Agent, or Firm—Sangya Jain

(57) ABSTRACT

A radiation sensitive resin composition containing an alkali-soluble resin, for example a novolak-quinonediazide positive-working radiation sensitive resin composition and a chemically amplified negative-working resin composition, wherein the alkali-soluble resin contains at least an alkali-soluble resin obtained by polycondensation of a compound represented by the following general formula (I) and a phenol if necessary, with an aldehyde.

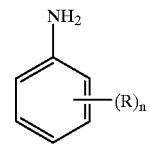

(I)

wherein R represents a hydroxyl group or an alkyl group with 1 to 4 carbon atoms, n is 0 or an integer of 1 to 3 and, when n is 2 or 3, each R group may be the same or different.

6 Claims, No Drawings

RADIATION-SENSITIVE RESIN COMPOSITION

TECHNICAL FIELD

This invention relates to a radiation-sensitive resin composition for manufacture of semiconductor devices or liquid crystal display devices, more particularly, to a radiation-sensitive resin composition for manufacture of semiconductor devices or liquid crystal display devices, which can form a good pattern, shows excellent adhesion to a substrate and yet can be easily removed with a remover.

BACKGROUND ART

In a process for manufacturing semiconductor devices such as IC or LSI or liquid crystal displays, fine patterns have been formed by forming a photoresist layer on a silicon substrate, a substrate having a metal layer such as aluminum, molybdenum, chromium, etc. or a substrate having a metal oxide layer such as ITO (indium tin oxide), irradiating this photoresist layer through a mask pattern with UV light or the like, then developing it, and etching the substrate using the resulting photoresist pattern as the mask.

Various radiation-sensitive resin compositions have conventionally been proposed which are used in such photolithography. Examples of such compositions include the positive-working radiation-sensitive composition wherein an alkali-soluble novolak resin is combined with a radiation-sensitive component of quinonediazide group-containing compound (Japanese Unexamined Patent Publication No. H07-120914) and the negative-working radiation-sensitive composition wherein an alkali-soluble novolak resin, a cross-linking agent of alkoxymethylated melamine, and an acid generating agent of halogenated triazine are combined with each other (Japanese Unexamined Patent Publication No. H05-303196).

Accurate etching of the substrate with the aid of photoresist requires good adhesion between the resist pattern and the substrate. To improve the adhesion between the resist pattern and the substrate, so-called post-baking has been processwise proposed which comprises baking (heat-treating) the photoresist pattern obtained by the development. As an approach of using materials, it has been proposed to add an adhesion-improving agent to the radiation-sensitive resin composition. For example, an adhesion-improving agent such as a benzimidazole, a polybenzimidazole or the like is incorporated in a positive-working photoresist (Japanese Unexamined Patent Publication No. H06-27657) and a benzotriazole is incorporated in a negative-working photoresist (Japanese Unexamined Patent Publication No. H08-339087).

However, as is well known, if post-baking is conducted in order to improve adhesion between the resist and the substrate, subsequent removal of the photoresist becomes difficult particularly with a negative-working photoresist. Further, a positive-working resist is removed generally through dissolution in a remover, whereas a negative-working photoresist is usually swollen and not dissolved, and is removed by peeling. In the case of peeling off the photoresist, however, there arises the problem that the peeled photoresist pieces may again deposit on the substrate to cause pattern defects. Still further, a substrate with an ITO layer absorbs basic components such as amine, etc. in the air which inactivates an acid once generated by light exposure in the photoresist, thus causing a problem of pattern bite into the interface between the photoresist and the substrate. Under such circumstances, there has been demanded a photoresist which can form a good resist pattern, good adhesion to a substrate, and enough high removability to be easily dissolved in a remover or the like.

Therefore, an object of the present invention is to provide a negative- or positive-working radiation-sensitive resin composition containing an alkali-soluble resin which composition can form an undercut- or footing-free excellent resist pattern on a silicon substrate, a substrate having a metal layer or a substrate having a metal oxide layer, which can, even after subjected to heat-treating after development for the purpose of improving adhesion, be easily dissolved in and removed with a remover.

DISCLOSURE OF THE INVENTION

As a result of intensive investigations, the inventors have found that the above-described object can be achieved by incorporating, in a radiation-sensitive resin composition containing an alkali-soluble resin composition, an alkali-soluble resin obtained by using the compound represented by the following general formula (I) as one monomer component (hereinafter also referred to as "aniline modified resin") as the alkali-soluble resin, thus having completed the present invention based on the finding.

That is, the present invention is a radiation-sensitive resin composition containing an alkali-soluble resin, wherein said alkali-soluble resin contains at least an alkali-soluble resin synthesized using as a monomer component a compound represented by the following general formula (I):

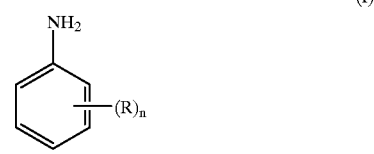

wherein R represents a hydroxyl group or an alkyl group with 1 to 4 carbon atoms, n is 0 or an integer of 1 to 3 and, when n is 2 or 3, each R group may be the same or different.

As the aniline modified resins to be used in the present invention, those which are obtained by polycondensation of the compound represented by the above general formula (I) and a phenol with an aldehyde such as formalin are most preferred. The present invention will therefore be described in more detail by reference to a radiation-sensitive resin composition containing the aniline modified resin obtained by such polycondensation.

As the compounds of the general formula (I) to be used as a monomer component constituting the aniline modified resin, there are illustrated aniline, 2,3-dimethylaniline, 2,4-dimethylaniline, 2,5-dimethylaniline, 2,6-dimethylaniline, 3,4-dimethylaniline, 3,5-dimethylaniline, 2,6-diethylaniline, 2,6-diisopropylaniline, 3,5-di-tert-butylaniline, 2,4,6-trimethylaniline, 2,4,6-tri-tert-butylaniline, etc. These compounds may be used alone or as a mixture of two or more thereof.

As the phenols to be used as a starting material of the above-described polycondensation resin, any of those may be used which have conventionally been used for forming alkali-soluble resins. Specific examples of such phenols include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5- trimethylphenol, methylenebisphenol, methylenebis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, etc. These compounds may be used alone or in combination of two or more thereof.

As the aldehydes, paraformaldehyde, acetaldehyde, benzaldehyde, hydroxybenzaldehyde, chloroacetaldehyde, etc. may be used, as well as formalin, alone or as a mixture of two or more thereof.

The aniline modified polycondensation resin to be used in the present invention may readily be obtained in the same manner as with known novolak phenol resins, i.e., by heating the phenol compound and the aldehyde compound in the presence of an acid catalyst to react. Specifically, the aniline modified resin in accordance with the present invention is produced by mixing, with 100 parts by weight of the phenol compound, usually 0.1–60 parts by weight of the compound represented by the general formula (I), 10–20 parts by weight of the aldehyde compound and 1–3 parts by weight of oxalic acid, and conducting the reaction at a reaction temperature of 85–95° C. for at least 4 hours.

The aniline modified resin in accordance with the present invention has a weight average molecular weight of 500–10,000, preferably 1,000–5,000.

The thus obtained aniline modified resin may be used alone or in combination with a conventionally known, aniline unmodified alkali-soluble resin or resins. As the known alkali-soluble resins usable in combination with the aniline modified resin, those novolak resins are preferred which are obtained by polycondensation between at least one of the above-described phenol compounds and at least one of the aldehyde compounds. A preferable content of the compound of formula (I) in the total alkali-soluble resin is preferably 0.1 to 40% by weight, more preferably 1 to 30% by weight.

The radiation-sensitive resin composition of the present invention containing the aniline modified resin may be of positive-working type or negative-working type. Typical examples of the positive-working radiation-sensitive resin composition are so-called quinonediazide-novolak type radiation-sensitive resin compositions wherein a quinonediazide group-containing compound is incorporated as a radiation-sensitive agent. In this quinonediazide-novolak type radiation-sensitive resin composition, the above-described aniline modified resin obtained by polycondensation and, if necessary, a known alkali-soluble resin or resins such as novolak resins used in quinonediazide-novolak resists are used as the alkali-soluble resin.

As the quinonediazide group-containing, radiation-sensitive agents, any of those known radiation-sensitive agents may be used that have conventionally been used in quinonediazide-novolak resists. Preferable radiation-sensitive agents are those which are obtained by reacting naphthoquinonediazidesulfonyl chloride or benzoquinonediazidesulfonyl chloride with a low-molecular or high-molecular compound having a functional group or groups capable of undergoing condensation reaction with the acid chloride. As the functional group capable of undergoing condensation reaction with acid chloride, there are illustrated a hydroxyl group and an amino group, with hydroxyl group being preferred especially. Examples of the compound capable of undergoing condensation reaction with an acid containing a hydroxyl group include hydroquinone; resorcinol; hydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,6'-pentahydroxybenzophenone, etc.; hydroxyphenylalkanes such as bis(2,4-dihydroxyphenyl)methane, bis(2,3,4-trihydroxyphenyl)methane, bis(2,4-dihydroxyphenyl) propane, etc.; hydroxytriphenylmethanes such as 4,4',3",4"-tetrahydroxy-3,5,3',5'-tetramethyltriphenylmethane, 4,4',2", 3",4"-pentahydroxy-3,5,3',5'-tetramethyltriphenyl-methane, etc.; and the like. These may be used alone or in combination of two or more thereof.

The quinonediazide group-containing, radiation-sensitive agent is incorporated in an amount of usually 5 to 50 parts by weight, preferably 10 to 40 parts by weight, per 100 parts by weight of the alkali-soluble resin.

Typical examples of the negative-working radiation-sensitive resin composition of the present invention are ternary chemically amplified negative-working resists which comprise an alkali-soluble base resin, a cross-linking agent and an acid-generating agent.

As the alkali-soluble base resin, the above-described aniline modified resins obtained by polycondensation and optionally those which have so far been used as alkali-soluble base resins in ternary chemically amplified negative-working resists, such as novolak resins, are used.

As the cross-linking agent for the chemically amplified negative-working resists, any of those may be used which have so far been used as cross-linking agents for chemically amplified negative-working resists. Preferable examples of the cross-linking agents include alkoxyalkylated amino resins such as alkoxyalkylated melamine resins, alkoxyalkylated benzoguanamine resins, alkoxyalkylatedurea resins, etc. Gas well asmelamine type, guanamine type and urea type low-molecular derivatives. Specific examples of such alkoxyalkylated amino resins include methoxymethylated melamine resin, ethoxymethylated melamine resin, propoxymethylated melamine resin, butoxymethylated melamine resin, ethoxymethylated benzoguanamine resin, methoxymethylated urea resin, ethoxymethylated urea resin, propoxymethylated urea resin, butoxymethylated urea resin, etc. Examples of the melamine type, guanamine type and urea type low-molecular derivatives include methoxymethylated melamine, ethoxymethylated melamine, propoxymethylated melamine, butoxymethylated melamine, hexamethylol melamine, acetoguanamine, benzoguanamine, methylated benzoguanamine, monomethylol urea, dimethylol urea, etc. Of these, melamine type and benzoguanamine type low-molecular derivatives, alkoxyalkylated benzoguanamine resins and alkoxyalkylated melamine resins are preferred.

These cross-linking agents may be used alone or in combination of two or more thereof, and are incorporated in an amount of usually 2 to 50 parts by weight, preferably 5 to 30 parts by weight, per 100 parts by weight of the alkali-soluble resin.

As the acid-generating agents, there are illustrated onium salts such as iodonium salts, sulfonium salts, diazonium salts, ammonium salts, pyridinium salts, etc.; halogen-containing compounds such as haloalkyl group-containing hydrocarbon compounds, haloalkyl group-containing heterocyclic compounds, etc.; diazoketone compounds such as 1,3-diketo-2-diazo compounds, diazobenzoquinone compounds, diazonaphthoquinone compounds, etc.; sulfone compounds such as β-ketosulfon, β-sulfonylsulfone, etc.;

sulfonic acid compounds such as alkylsulfonic acid esters, haloalkylsulfonic acid esters, arylsulfonic acid esters, iminosulfonates, etc.; and the like. These acid-generating agents may be used alone or in combination of two or more thereof, and are incorporated in an amount of usually 0.1 to 10 parts by weight, preferably 0.5 to 5.0 parts by weight, per 100 parts by weight of the alkali-soluble resin.

Further, it is preferable to incorporate a basic compound as an additive in the chemically amplified negative-working resists. This basic compound functions to control diffusion, in the resist layer, of the acid generated from the acid-generating agent upon exposure to thereby improve resolution or exposure latitude. Such basic compounds include primary, secondary or tertiary aliphatic amines, aromatic amines, heterocyclic amines, nitrogen compounds containing an alkyl group, an aryl group, etc., compounds containing an amido group or an imido group, and the like.

As the solvent for dissolving the positive-working or negative-working radiation-sensitive resin composition of the present invention, there are illustrated ethylene glycol monoalkyl ethers such as ethylene glycol monomethyl ether, ethylene glycol monoethyl ether, etc.; ethylene glycol monoalkyl ether acetates such as ethylene glycol monomethyl ether acetate, ethylene glycol monoethyl ether acetate, etc.; propylene glycol monoalkyl ethers such as propylene glycol monomethyl ether, propylene glycol monoethyl ether, etc.; propylene glycol monoalkyl ether acetates such as propylene glycol monomethyl ether acetate, propylene glycol monoethyl ether acetate, etc.; lactic esters such as methyl lactate, ethyl lactate, etc.; aromatic hydrocarbons such as toluene, xylene, etc.; ketones such as methyl ethyl ketone, 2-heptanone, cyclohexanone, etc.; amides such as N,N-dimethylacetamide, N-methylpyrrolidone, etc.; lactones such as γ-butyrolactone, etc.; and the like. These solvents may be used alone or in combination of two or more thereof. In the radiation-sensitive resin composition of the present invention may be incorporated, if necessary, dyes, adhesion aids, surfactants, etc. Examples of the dyes include Methyl Violet, Crystal Violet, Malachite Green, etc., examples of the adhesion aids include alkylimidazolines, butyric acid, alkyl acids, polyhydroxystyrene, polyvinyl methyl ether, t-butylnovolak, epoxysilane, epoxy polymers, silanes, etc., and examples of the surfactants include nonionic surfactants such as polyglycols and the derivatives thereof, i.e., polypropylene glycol or polyoxyethylene lauryl ether, etc.; fluorine-containing surfactants such as Fluorad (trade name; product of Sumitomo 3M Co., Ltd.), Megafac (trade name; product of Dai-nippon Ink & Chemicals, Inc.), Surflon (trade name; product of Asahi Glass Company, Ltd.) and organosiloxane surfactants such as KP341 (trade name; product of Shin-Etsu Chemical Co., Ltd).

BEST MODE FOR PRACTICING THE INVENTION

The present invention will now be described more specifically by reference to Examples which, however, are not to be construed to limit the present invention in any way.

Synthesis Example 1
(Synthesis of Aniline Modified Resin A)

Parts by weight of aniline, 45 parts by weight of 37 wt % formaldehyde, and 1.8 parts by weight of oxalic acid were charged per 100 parts by weight of a cresol mixture (m-cresol/p-cresol=6/4), and the reaction was conducted at a reaction temperature of 90° C. for 4 hours. This aniline modified resin A had a molecular weight of 1,800 as determined using polystyrene standards.

Synthesis Example 2
(Synthesis of Aniline Modified Resin B)

Aniline modified resin B was obtained in the same manner as in Synthesis Example 1 except for using 100 parts by weight of o-cresol in place of 100 parts by weight of the cresol mixture.

EXAMPLES 1–3 m- and p-cresol novolak resin (m-cresol/p-cresol=6/4; weight-average molecular weight: 10,000 as determined using polystyrene standards), 2,3,4-trihydroxybenzophenone-o-naphthoquinone-1,2-diazido-sulfonic acid triester as a radiation-sensitive agent, and the aniline modified resin A obtained in Synthesis Example 1 were dissolved in propylene glycol monomethyl ether acetate in a proportion (by weight) given in Table 1, and the resulting solution was filtered through a Teflon®-made 0.2 μm membrane filter to prepare positive-working radiation-sensitive compositions of the present invention.

Each of the compositions was spin-coated on a 4-inch silicon wafer having thereon an ITO layer, and baked at 100° C. for 90 seconds on a hot plate to obtain a 1.5 μm-thick resist coating. This resist coating was exposed using a g-line stepper made by GCA Co. (DSW6400, NA=0.42), followed by developing in a 0.9 wt % potassium hydroxide aqueous solution for 60 seconds to form a pattern. Etching was conducted with a mixed solution of hydrochloric acid and ferric chloride using the thus formed patterns as a mask to thereby form, on a silicon wafer, a pattern of ITO with the resist thereon. Etching time was determined so that resist-free ITO layer on the substrate was completely etched off upon being dipped in an etching solution, that is, just etching period. After the etching procedure, pattern form of a 5 μm-line line pattern was observed under a scanning electron microscope (SEM).

In general, post-baking after development serves to improve adhesion to the substrate. Hence, post-baking was additionally conducted at 130° C. for 3 minutes after development and before etching, followed by the same etching procedure in the same manner as described above, and pattern form of the resulting line patterns was also observed under SEM. Results thus obtained are tabulated in Table 1. It can be seen from Table 1, that addition of the aniline modified resin serves to reduce or almost prevent undercut even without conducting post-baking and that post-baking, when conducted, ensures to completely prevent undercut.

Comparative Example 1

Procedures in Example 1 were repeated except for not adding the aniline modified resin and pattern form was observed after etching procedure. Results thus obtained are shown in Table 1. A serious undercut was observed when post-baking was not conducted after development. In the case of conducting post-baking after development, too, undercut was not completely prevented, though reduced to some extent.

TABLE 1

|  | Novolak Resin/ Radiation-sensitive Agent | Aniline Modified Resin A | Form of Line Pattern (without post-baking) | Form of Line Pattern (with post-baking) |
|---|---|---|---|---|
| Example 1 | 100/15 | 5 | Δ | ◯ |
| Example 2 | 100/15 | 10 | ◯ | ◯ |

TABLE 1-continued

| | Novolak Resin/ Radiation-sensitive Agent | Aniline Modified Resin A | Form of Line Pattern (without post-baking) | Form of Line Pattern (with post-baking) |
|---|---|---|---|---|
| Example 3 | 100/15 | 15 | ○ | ○ |
| Comparative Example 1 | 100/15 | 0 | X | Δ |

○: with almost no undercut
Δ: with reduced undercut
X: with undercut

EXAMPLES 4–6

Patterns were formed in the same manner as in Examples 1–3 using the photoresist compositions obtained in Examples 1 to 3. After formation of the patterns, etching was conducted in the same manner as in Examples 1 to 3 using each pattern as a mask. Then, the resists were removed according to a dipping method at 35° C. for 300 seconds using Remover 100 (made by Clariant Japan K.K.) as a remover. Separately, post-baking was additionally conducted at 130, 150 and 170° C., respectively, each for 5 minutes before the same resist-removing treatment. Results thus obtained are tabulated in Table 2. Resist coatings were removed by dissolution in the both cases of removing the resist without conducting post-baking and removing the resist with conducting post-baking at 130, 150 or 170° C. for 5 minutes after conducting development.

Comparative Example 2

A radiation-sensitive resin composition was prepared in the same manner as in Comparative Example 1, and pattern formation was conducted in the same manner. Results obtained by conducting etching and resist-removing treatment without post-baking and results obtained by conducting etching and resist-removing treatment after post-baking at 130, 150 or 170° C. in the same manner as in Example 4 are shown in Table 2. In case where post-baking was additionally conducted, the resists were not removed within a predetermined period of time whereas, where removing treatment was conducted for a longer time, the resists were removed not by dissolution but by peeling.

TABLE 2

| | Novolak Resin/ Radiation-sensitive Agent | Aniline Modified Resin | Without Post-baking | 130° C. | 150° C. | 170° C. |
|---|---|---|---|---|---|---|
| Example 4 | 100/15 | 5 | ○ | ○ | ○ | X |
| Example 5 | 100/15 | 10 | ○ | ○ | ○ | ○ |
| Example 6 | 100/15 | 15 | ○ | ○ | ○ | ○ |
| Comparative Example 2 | 100/15 | 0 | ○ | X | X | X |

○: removable by dissolution
X: impossible to be removed by dissolution

EXAMPLE 7

| | |
|---|---|
| m-, p-Cresol novolak resin (m-cresol/p-cresol = 6/4; weight average molecular weight as determined using polystyrene standards: 4,000) | 100 parts by weight |
| Ethoxymethylated benzoguanamine resin | 25 parts by weight |
| 2,4,6-Tris(trichloromethyl)-triazine | 3 parts by weight |
| Aniline modified resin A obtained in Synthesis Example 1 | 20 parts by weight |
| Tetrabutylammonium hydroxide | 0.5 part by weight |

The above-described components were dissolved in propylene glycol monomethyl ether acetate, and filtered through a Teflon-made, 0.2 $\mu$m membrane filter to prepare a negative-working radiation-sensitive composition.

This composition was spin-coated on a 4-inch silicon wafer having thereon an ITO layer, and baked at 100° C. for 90 seconds on a hot plate to obtain a 1.5 $\mu$m-thick resist coating. This resist coating was exposed using ag-line stepper made by GCACo. (DSW6400, NA=0.42) and was subjected to post-exposure baking (PEB) at 130° C. for 90 seconds, followed by developing in a 2.38 wt % tetramethylammonium hydroxide aqueous solution for 60 seconds to form a pattern. Etching was conducted with a mixed solution of hydrochloric acid and ferric chloride using the thus formed patterns as a mask to thereby form, on a silicon wafer, a pattern of ITO with the resist thereon. Observation of the 5 $\mu$m line pattern under a scanning type electron microscope (SEM) before and after the etching revealed formation of good patterns with almost no undercut. In the case of conducting post-baking treatment at 140° C. for 3 minutes after development, better patterns were observed.

Next, patterns formed were subjected to the treatment of removing the resist according to a dipping method at 23° C. for 60 seconds using Remover 100 (made by Clariant Japan K.K.) as a remover, thus the resist being removed by dissolution. In the case of similar removal of the resist after additionally conducting post-baking at 140° C. for 3 minutes after the development, the resist coating was also removed by dissolution.

EXAMPLE 8

A radiation-sensitive resin composition was prepared in the same manner as in Example 7 except for using the aniline modified resin B obtained in Synthesis Example 2, and formation of line patterns, etching and observation of line patterns before and after etching were conducted.

The formed pattern was dissolved to remove by conducting the removing treatment in the same manner as in Example 7.

In case where post-baking was additionally conducted at 140° C. for 3 minutes after development, the resist coating was also dissolved to remove by the same removing treatment.

Comparative Example 3

A photoresist composition was prepared in the same manner as in Example 7 except for not adding the aniline modified resin. When formation of line patterns, etching and observation of the form of line patterns before and after etching were conducted, there was observed serious undercut. This undercut was unable to be prevented completely by additionally conducting post-baking in the same manner as in Example 7 after development.

Further, the formed line patterns were unable to be removed by the removing treatment in the same manner as in Example 7. When period of the removing treatment was prolonged, the resist coating was removed in a peeling way, leaving undissolved photoresist residues floating.

Results of Examples 7 and 8 and Comparative Example 3 are tabulated in the following Table 3.

TABLE 3

|  | Form of Line Pattern | | | | Removability of Resist | |
|  | Before Etching *1 | | After Etching *2 | | | |
| Post-baking | not conducted | Conducted | Not conducted | conducted | not conducted | Conducted |
| Example 7 | ○ | ○ | Δ | ○ | removable by dissolution | Removable by dissolution |
| Example 8 | ○ | ○ | Δ | ○ | removable by dissolution | Removable by dissolution |
| Comparative Example 3 | X | Δ | X | Δ | not removable by dissolution | Not removable by dissolution |

*1 (Before etching)
○: with no pattern bite
Δ: reduced pattern bite
X: with pattern bite
*2 (After etching)
○: with no pattern bite
Δ: reduced pattern bite
X: with pattern bite Advantages of the Invention The present invention provides a radiation-sensitive resin composition which can form good pattern particularly with high adhesion to a substrate and, when treated with a remover, can be easily removed not by peeling but by dissolution.

Industrial Utility

As has been described hereinbefore, the radiation-sensitive resin composition of the present invention is preferably used as an etching resist or the like in manufacturing semiconductor devices or liquid crystal display.

What is claimed is:

1. A positive-working radiation-sensitive resin composition

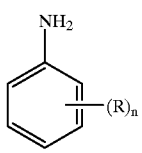
(I)

consisting essentially of an alkali-soluble resin, a quinonediazide compound and a solvent, wherein said alkali-soluble resin contains at least an alkali-soluble resin synthesized using as a monomer component a compound represented by the general formula (I):

wherein R represents a hydroxyl group or an alkyl group with 1 to 4 carbon atoms, n is 0 or an integer of 1 to 3 and when n is 2 or 3, each R group may be the same or different.

2. The radiation-sensitive resin composition according to claim 1, wherein the alkali-soluble resin contains an alkali-soluble resin obtained by polycondensation of the compound represented by the general formula (I) and phenols with one or a mixture of two or more of aldehydes.

3. The radiation-sensitive resin composition according to claim 1, wherein the ratio of the compound represented by the general formula (I) is in the range of 0.1 to 40% by weight in the total alkali-soluble resin.

4. A positive-working radiation-sensitive resin composition consisting essentially of an alkali-soluble resin, a quinonediazide compound, and a solvent, wherein said alkali-soluble resin contains a novolak resin and an alkali-soluble resin synthesized using as a monomer component a compound represented by the general formula (I):

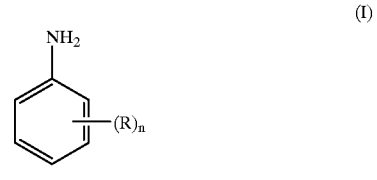
(I)

wherein R represents a hydroxyl group or an alkyl group with 1 to 4 carbon atoms, n is 0 or an integer of 1 to 3 and when n is 2 or 3, each R group may be the same or different.

5. The radiation-sensitive resin composition according to claim 4, wherein the alkali-soluble resin contains an alkali-soluble resin obtained by polycondensation of the compound represented by the general formula (I) and phenols with one or a mixture of two or more of aldehydes.

6. The radiation-sensitive resin composition according to claim 4, wherein the ratio of the compound represented by the general formula (I) is in the range of 0.1 to 40% by weight in the total alkali-soluble resin.

* * * * *